United States Patent
Chen et al.

(10) Patent No.: US 12,191,219 B2
(45) Date of Patent: Jan. 7, 2025

(54) GAS-PERMEABLE PACKAGE LID OF CHIP PACKAGE STRUCTURE AND MANUFACTURING METHOD THEREOF

(71) Applicant: Industrial Technology Research Institute, Hsinchu (TW)

(72) Inventors: Lung-Tai Chen, Kaohsiung (TW); Chin-Sheng Chang, Tainan (TW); Bor-Shiun Lee, New Taipei (TW); Chih-Hsiang Ko, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 386 days.

(21) Appl. No.: 17/578,447

(22) Filed: Jan. 19, 2022

(65) Prior Publication Data
US 2023/0163034 A1    May 25, 2023

(30) Foreign Application Priority Data

Nov. 22, 2021 (TW) ................................. 110143324

(51) Int. Cl.
*H01L 23/06* (2006.01)
(52) U.S. Cl.
CPC .................... *H01L 23/06* (2013.01)
(58) Field of Classification Search
CPC ........ H01L 23/06; H01L 23/564; H01L 23/04
USPC ........................................... 257/106
See application file for complete search history.

(56) References Cited

U.S. PATENT DOCUMENTS

| | | | |
|---|---|---|---|
| 6,265,750 B1 * | 7/2001 | Feng | G01N 27/404 257/428 |
| 6,326,228 B1 * | 12/2001 | Hughes | G01N 27/12 438/49 |
| 6,690,569 B1 | 2/2004 | Mayer et al. | |
| 7,827,847 B2 * | 11/2010 | Oishi | H01M 8/04455 73/23.2 |
| 8,156,815 B2 * | 4/2012 | Hunziker | G01F 1/684 73/706 |
| 8,803,092 B2 | 8/2014 | Kuze et al. | |
| 8,815,161 B2 * | 8/2014 | Oishi | G01N 27/125 73/23.31 |

(Continued)

FOREIGN PATENT DOCUMENTS

| | | |
|---|---|---|
| CN | 105226172 | 7/2017 |
| CN | 109305654 | 2/2019 |

(Continued)

OTHER PUBLICATIONS

WO 01/83190, Nov. 8, 2001, Sayer, Matthew, B29C45/17.*
"Office Action of Taiwan Counterpart Application", issued on Jun. 22, 2022, p. 1-p. 4.

*Primary Examiner* — William A Harriston
(74) *Attorney, Agent, or Firm* — JCIPRNET

(57) ABSTRACT

A gas-permeable package lid of a chip package structure and a manufacturing method thereof are provided. The gas-permeable package lid of the chip package structure includes a lid body, a through hole, and a hydrophobic gas-permeable membrane. The lid body is integrally formed. The through hole penetrates the lid body. The hydrophobic gas-permeable membrane is bonded to the lid body and shields the through hole. A part of the hydrophobic gas-permeable membrane is embedded in the lid body.

18 Claims, 6 Drawing Sheets

(56) References Cited

U.S. PATENT DOCUMENTS

| | | | |
|---|---|---|---|
| 8,852,513 B1* | 10/2014 | Speer | G01N 33/0014 422/83 |
| 9,708,174 B2 | 7/2017 | Ziglioli | |
| 9,976,976 B2 | 5/2018 | Nakano et al. | |
| 10,519,030 B2 | 12/2019 | Elian et al. | |
| 10,730,743 B2 | 8/2020 | Kierse et al. | |
| 10,760,930 B2* | 9/2020 | Jo | G01N 33/0009 |
| 11,022,576 B2* | 6/2021 | Ali | G01N 27/16 |
| 11,125,734 B2* | 9/2021 | Choi | H01L 23/3121 |
| 2005/0042141 A1* | 2/2005 | Otani | G01N 27/16 422/98 |
| 2007/0262358 A1 | 11/2007 | Burgmair et al. | |
| 2014/0225202 A1* | 8/2014 | Mayer | H01L 21/76802 438/49 |
| 2019/0064093 A1* | 2/2019 | Ura | G01N 27/12 |
| 2019/0204281 A1* | 7/2019 | Choi | H01L 24/49 |
| 2019/0242847 A1* | 8/2019 | Berduque | G01N 27/4045 |
| 2020/0300711 A1* | 9/2020 | Tu | G01F 1/6845 |

FOREIGN PATENT DOCUMENTS

| | | |
|---|---|---|
| CN | 105277594 | 5/2020 |
| TW | 200725821 | 7/2007 |
| TW | I290358 | 11/2007 |
| TW | 201126661 | 8/2011 |
| TW | I674653 | 10/2019 |
| TW | I682018 | 1/2020 |
| TW | 202027310 | 7/2020 |
| TW | 202113137 | 4/2021 |
| TW | I725738 | 4/2021 |

\* cited by examiner

GAS-PERMEABLE PACKAGE LID OF CHIP PACKAGE STRUCTURE AND MANUFACTURING METHOD THEREOF

CROSS-REFERENCE TO RELATED APPLICATION

This application claims the priority benefit of Taiwan application serial no. 110143324, filed on Nov. 22, 2021. The entirety of the above-mentioned patent application is hereby incorporated by reference herein and made a part of this specification.

BACKGROUND

Technical Field

The disclosure relates to a gas-permeable package lid of a chip package structure and a manufacturing method thereof, and in particular to a gas-permeable package lid of a chip package structure having a hydrophobic gas-permeable membrane and a manufacturing method thereof.

Description of Related Art

With the rising awareness of environmental health and environmental protection, air quality monitoring has been widely implemented, and monitoring is achieved mainly through the use of gas sensors to sense the environment for a long time. In order for gas sensors to adapt to long-term operation and different environments or climates, requirements for environmental tolerance of gas sensors are gradually increasing.

In most of the currently commercially available gas sensors, a hydrophobic gas-permeable membrane is fixed on the gas sensor's air inlet through an adhesive after chip packaging. However, the hydrophobic gas-permeable membrane must provide a hydrophobic function, and this hydrophobic property causes poor adhesion of the adhesive. Therefore, there may be poor bonding between the commercially available gas sensor and the hydrophobic gas-permeable membrane, which affects the durability of the gas sensor.

SUMMARY

The disclosure provides a gas-permeable package lid of a chip package structure and a manufacturing method thereof, which strengthen the bonding of the hydrophobic gas-permeable membrane and improve the reliability of elements.

A gas-permeable package lid of a chip package structure of the disclosure includes a lid body, a through hole, and a hydrophobic gas-permeable membrane. The lid body is integrally formed. The through hole penetrates the lid body. The hydrophobic gas-permeable membrane is bonded to the lid body and shields the through hole. A part of the hydrophobic gas-permeable membrane is embedded in the lid body.

A manufacturing method of a gas-permeable package lid of a chip package structure of the disclosure includes the following. A hydrophobic gas-permeable membrane is provided. A packaging material in liquid state is cured into a lid body. A through hole is formed in the lid body and penetrates the lid body. The hydrophobic gas-permeable membrane shields the through hole. A plurality of positioning holes of the hydrophobic gas-permeable membrane are embedded in the lid body. A plurality of hole anchoring portions of the lid body are respectively located in the positioning hole.

Based on the above, in the manufacturing method of the chip package structure and the gas-permeable package lid thereof of the disclosure, since a part of the hydrophobic gas-permeable membrane is embedded in the lid body, the hydrophobic gas-permeable membrane does not fall off easily and has a simple structure.

DESCRIPTION OF THE EMBODIMENTS

Figure 1:
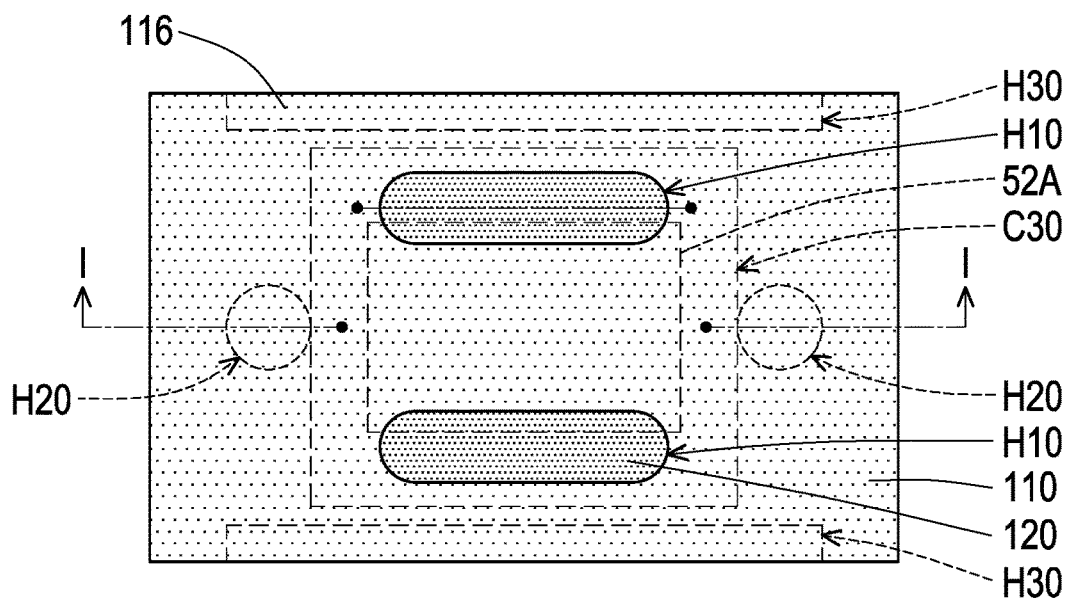
FIG. 1 is a schematic top view of a gas-permeable package lid of a chip package structure applied to the chip package structure according to an embodiment of the disclosure.
Figure 2:
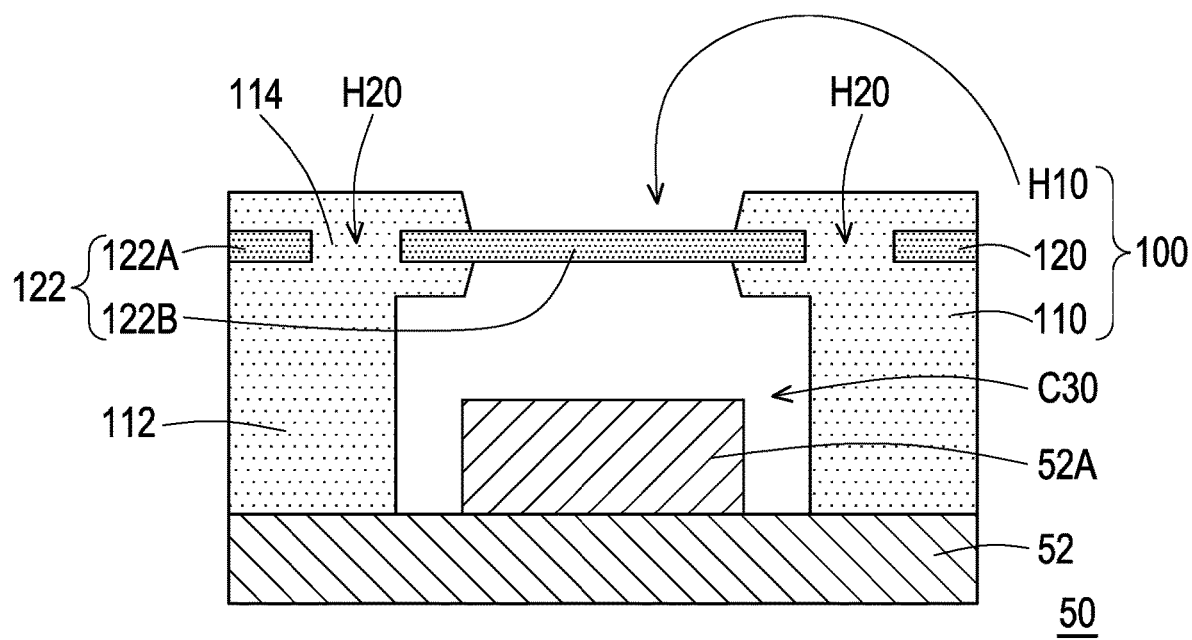
FIG. 2 is a schematic cross-sectional view taken along a sectional line I-I of FIG. 1.

FIG. 1 is a schematic top view of a gas-permeable package lid of a chip package structure applied to the chip package structure according to an embodiment of the disclosure. FIG. 2 is a schematic cross-sectional view taken along a sectional line I-I of FIG. 1. For the convenience of description, the middle section of the line I-I of FIG. 1 is offset by a certain distance compared with the two sides, so that a through hole and a positioning hole are both shown in FIG. 2. Referring to FIGS. 1 and 2, a gas-permeable package lid 100 to which the chip package structure 50 of this embodiment is applied includes a base 52 and a chip 52A. In this embodiment, the gas-permeable package lid 100 is assembled with the base 52 and covers the chip 52A. The gas-permeable package lid 100 and the base 52 form a chamber C30. The gas-permeable package lid 100 includes a lid body 110, a through hole H10, and a hydrophobic gas-permeable membrane 120. The lid body 110 is integrally formed. The through hole H10 penetrates the lid body 110.

The hydrophobic gas-permeable membrane 120 is bonded to the lid body 110 and shields the through hole H10. A part of the hydrophobic gas-permeable membrane 120 is embedded in the lid body 110. The hydrophobic gas-permeable membrane 120 of this embodiment includes a membrane body 122 and a plurality of positioning holes H20 penetrating the membrane body 122. The positioning holes H20 are embedded in the lid body 110. The chamber C30 communicates with the outside world through the hydrophobic gas-permeable membrane 120 and the through hole H10. Through the function of the hydrophobic gas-permeable membrane 120, external gas may enter the chamber C30 and contact the chip 52A; however, moisture and other foreign objects cannot enter the chamber C30. A portion of the hydrophobic gas-permeable membrane 120 is embedded in the lid body 110. A portion of the lid body 110 is located within the positioning holes H20.

In the chip package structure 50 of this embodiment, since the lid body 110 is integrally formed, that is, when the lid body 110 is formed, a part of the hydrophobic gas-permeable membrane 120 is embedded in the lid body 110, after the lid body 110 is formed, the hydrophobic gas-permeable membrane 120 is fixed. In this way, it may be ensured that the hydrophobic gas-permeable membrane 120 does not fall off, thereby improving the reliability of the gas-permeable package lid 100 of the chip package structure 50. In addition, no additional process is required to fix the hydrophobic gas-permeable membrane 120, which may reduce process and material costs.

In this embodiment, the through hole H10 is located above the chip 52A, and the hydrophobic gas-permeable membrane 120 is suspended above the chip 52A. In this way, the chip 52A may quickly respond to changes in the outside world. In addition, the chip 52A of this embodiment is a semiconductor chip and may be a gas sensing chip.

In this embodiment, the membrane body 122 has an embedding portion 122A embedded in the lid body 110 and a shielding portion 122B covering the through hole H10. The positioning holes H20 penetrates the embedding portion 122A and are located on opposite sides of the shielding portion 122B and also on opposite sides of the gas-permeable package lid 100, so the hydrophobic gas-permeable membrane 120 is stably fixed. In this embodiment, the lid body 110 has a body portion 112 surrounding the through hole H10 and a plurality of hole anchoring portions 114 located in the body portion 112. These hole anchoring portions 114 are respectively located in the positioning holes H20 of the hydrophobic gas-permeable membrane 120. The hole anchoring portion 114 of the lid body 110 is stuck in the positioning hole H20 of the hydrophobic gas-permeable membrane 120, so the hydrophobic gas-permeable membrane 120 is fixed by the lid body 110.

In addition, the hydrophobic gas-permeable membrane 120 of the present embodiment may further have a plurality of notches H30. The notch H30 penetrates the embedding portion 122A of the membrane body 122 and is adjacent to the edge of the membrane body 122, and is also located at the edge of the hydrophobic gas-permeable membrane 120. A portion of the lid body 110 passes through the notch H30, and the notch H30 is embedded in the lid body 110. On the other hand, the lid body 110 further has a plurality of notch anchoring portions 116 located in the body portion 112. These notch anchoring portions 116 are respectively located in the notches H30 of the hydrophobic gas-permeable membrane 120. The notch anchoring portion 116 of the lid body 110 is stuck in the notch H30 of the hydrophobic gas-permeable membrane 120, thereby having the function of clamping the hydrophobic gas-permeable membrane 120 and preventing the displacement of the hydrophobic gas-permeable membrane 120. The notches H30 of this embodiment are located, for example, on opposite sides of the gas-permeable package lid 100.

In this embodiment, the surfaces of a part of the hydrophobic gas-permeable membrane 120 around the through hole H10 that face toward and away from the chip 52A are both covered by the lid body 110. In other words, the portion of the hydrophobic gas-permeable membrane 120 around the through hole H10 is clamped from above and below by the lid body 110. On the other hand, the embedding portion 122A of the hydrophobic gas-permeable membrane 120 is located around the through hole H10, and the surfaces of the embedding portion 122A facing toward and away from the chip 52A are both covered by the lid body 110, and neither the surface of the shielding portion 122B of the hydrophobic gas-permeable membrane 120 facing toward and the chip 52A nor the surface of the shielding portion 122B of the hydrophobic gas-permeable membrane 120 facing away from the chip 52A is covered by the lid body 110.

In this embodiment, the hydrophobic gas-permeable membrane 120 is coated with polytetrafluoroethylene, thereby being hydrophobic and breathable. In this embodiment, the material of the gas-permeable package lid 100 is, for example, plastic.

Figure 3:
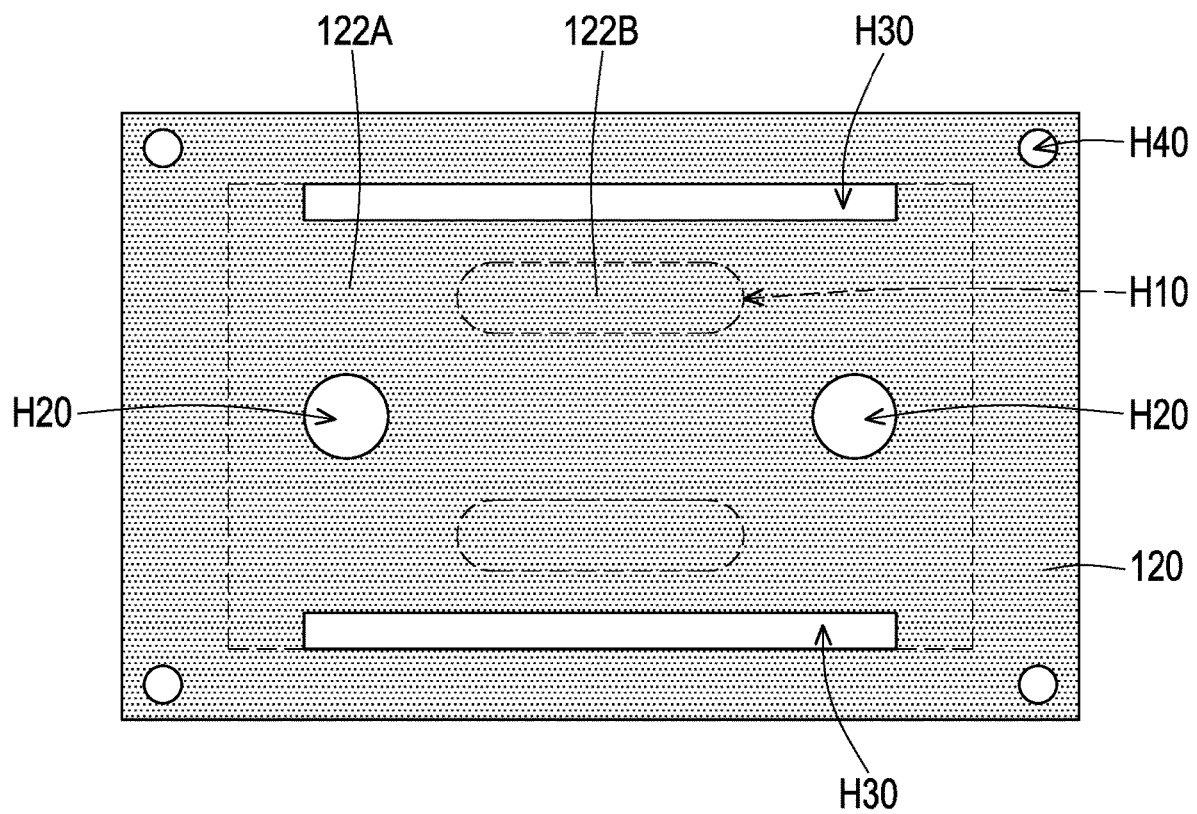
FIG. 3 is a schematic top view of a hydrophobic gas-permeable membrane of the gas-permeable package lid of the chip package structure of FIG. 1 at a material stage.

FIG. 3 is a schematic top view of a hydrophobic gas-permeable membrane of the gas-permeable package lid of the chip package structure of FIG. 1 at a material stage. Referring to FIGS. 1 and 3, the hydrophobic gas-permeable membrane 120 of the embodiment has a larger size before being embedded in the lid body 110. In addition to the previously described positioning hole H20 and notch H30, the hydrophobic gas-permeable membrane 120 further has a plurality of openings H40 around the periphery to for positioning in the process. After the hydrophobic gas-permeable membrane 120 is embedded in the lid body 110, a portion of the hydrophobic gas-permeable membrane 120 which goes beyond the lid body 110 is cut off, and the opening H40 is cut off, too.

Figure 4:
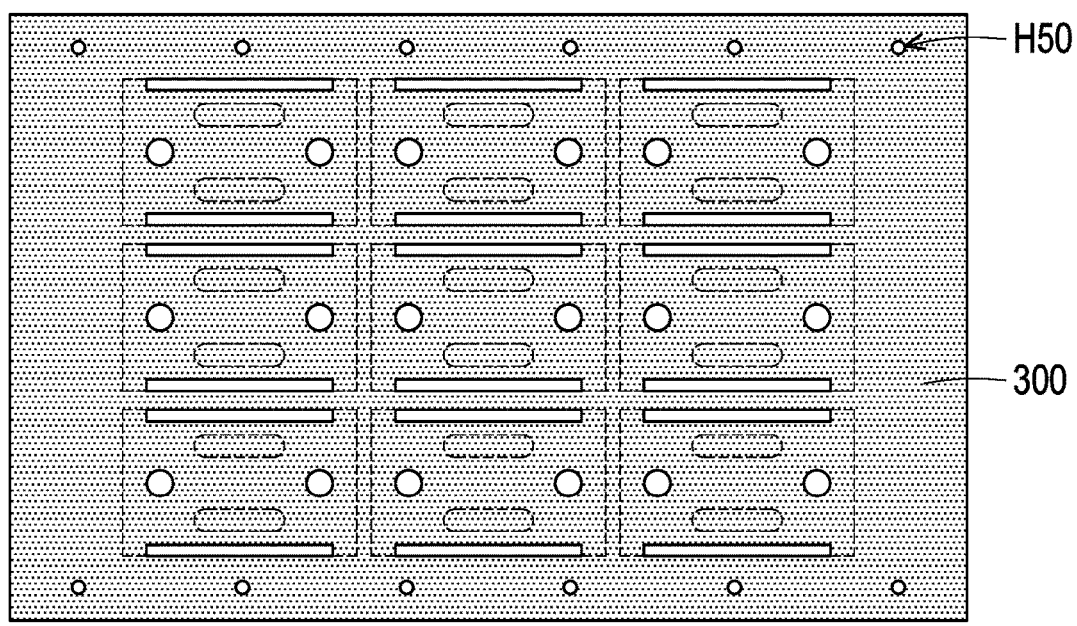
FIG. 4 is a schematic top view of the hydrophobic gas-permeable membrane of the gas-permeable package lid of the chip package structure of FIG. 1 at a material stage according to another embodiment.

FIG. 4 is a schematic top view of the hydrophobic gas-permeable membrane of the gas-permeable package lid of the chip package structure of FIG. 1 at a material stage according to another embodiment. Referring to FIG. 4, a hydrophobic gas-permeable membrane 300 of this embodiment is similar to the hydrophobic gas-permeable membrane 120 of FIG. 3, but the difference lies in that nine hydrophobic gas-permeable membranes 120 formed in a hydrophobic gas-permeable membrane 300 as shown in FIG. 2, adapted for batch manufacturing. There are also a plurality of openings H50 around the hydrophobic gas-permeable membrane 300, which are used for positioning in the process.

Figure 5:
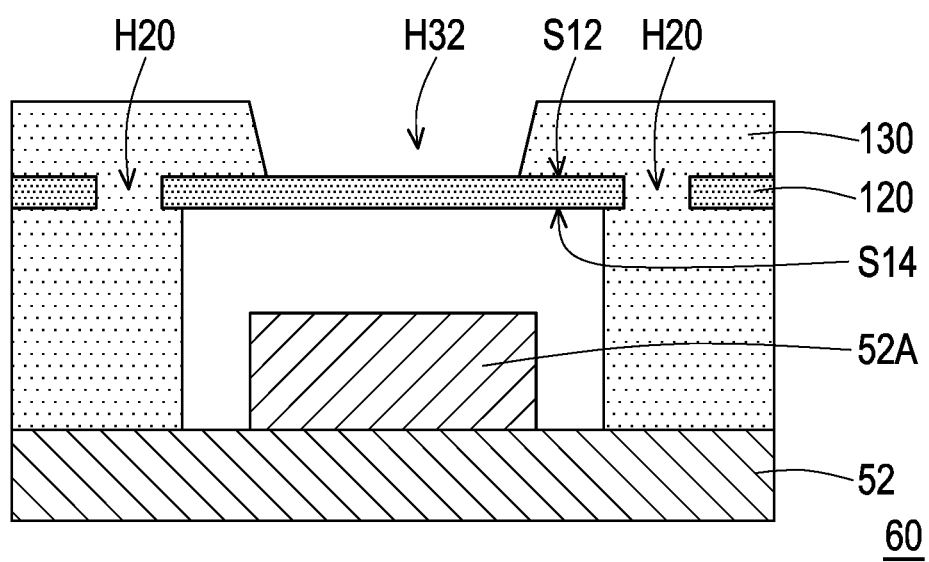
FIG. 5 is a schematic cross-sectional view of a gas-permeable package lid of a chip package structure applied to the chip package structure according to another embodiment of the disclosure.

FIG. 5 is a schematic cross-sectional view of a gas-permeable package lid of a chip package structure applied to the chip package structure according to another embodiment of the disclosure. Referring to FIG. 5, a chip package structure 60 of this embodiment is basically the same as the chip package structure 50 of FIG. 2, and only the differences between the two are described herein. A surface S12 of a part of the hydrophobic gas-permeable membrane 120 of chip package structure 60 around a through hole H32 that faces away from the chip 52A is covered by the lid body 130, and a surface S14 of a part of the hydrophobic gas-permeable membrane 120 around the through hole H32 that faces toward the chip 52A is not covered by the lid body 130. However, the other parts of the hydrophobic gas-permeable membrane 120 are still embedded in the lid body 110, so the hydrophobic gas-permeable membrane 120 may still be firmly positioned.

Figure 6A:
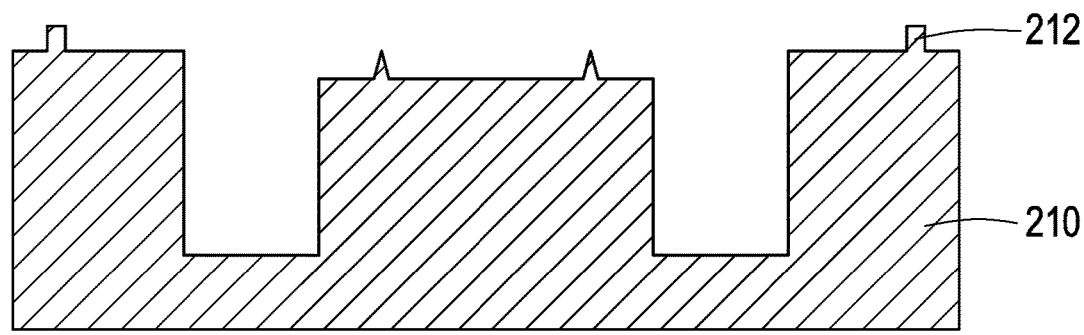
FIGS. 6A to 6E are schematic cross-sectional views of a manufacturing method of a gas-permeable package lid of a chip package structure according to an embodiment of the disclosure.
Figure 6B:
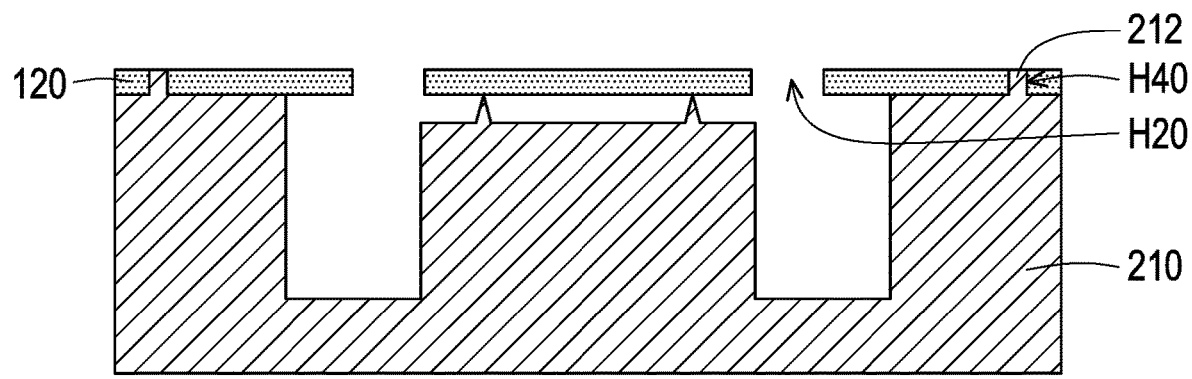
Figure 6C:
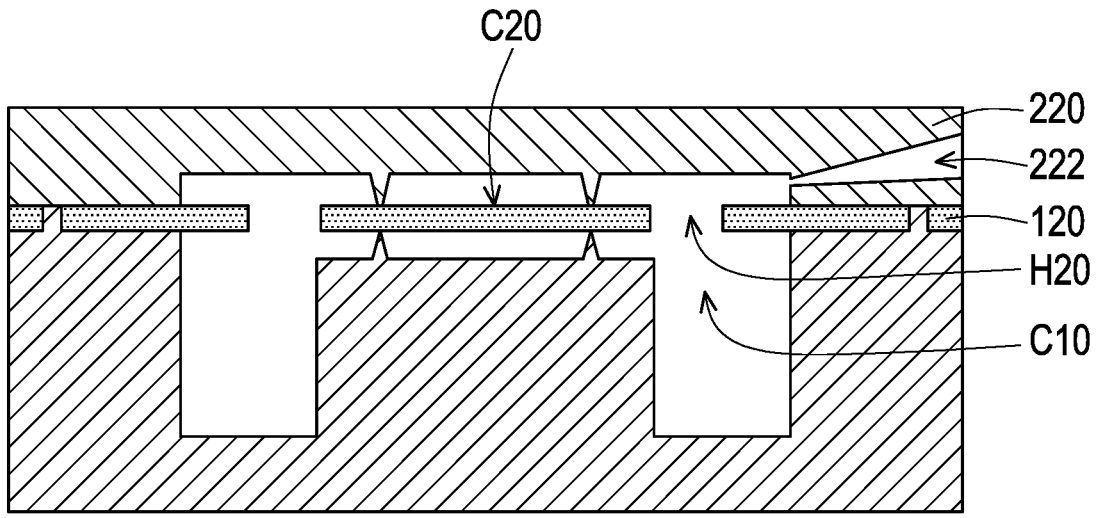

FIGS. 6A to 6E are schematic cross-sectional views of a manufacturing method of a gas-permeable package lid of a chip package structure according to an embodiment of the disclosure. The manufacturing method of a gas-permeable package lid of a chip package structure of this embodiment at least includes the steps shown in FIG. 6B and FIG. 6D. Referring to FIG. 6B, the hydrophobic gas-permeable membrane 120 is provided. In this embodiment, the hydrophobic gas-permeable membrane 120 has a plurality of positioning holes H20. Next, referring to FIG. 6D, a packaging material 110A in liquid state is cured into the lid body 110. One through hole H10 is formed in the lid body 110 and penetrates the lid body 110. The hydrophobic gas-permeable membrane 120 shields the through hole H10. A portion of the hydrophobic gas-permeable membrane 120 having the positioning hole H20 is embedded in the lid body 110; that is, the positioning hole H20 is embedded in the lid body 110. A portion of the lid body 110 penetrates the positioning hole H20; that is, a plurality of hole anchoring portions 114 of the lid body 110 are respectively located in these positioning holes H20.

In a manufacturing method of a gas-permeable package lid of a chip package structure of this embodiment, since the hydrophobic gas-permeable membrane 120 is fixed when the lid body 110 is integrally formed, there is no need to perform additional processes to fix the hydrophobic gas-permeable membrane 120; therefore, process and material costs may be reduced.

In this embodiment, the step of curing the packaging material 110A in liquid state into the lid body 110 and embedding the positioning hole H20 of the hydrophobic gas-permeable membrane 120 in the lid body 110 is performing an embedded injection molding process, but the disclosure is not limited thereto.

An example is given below to illustrate other specific steps of the manufacturing method of a gas-permeable package lid of a chip package structure, but the disclosure is not limited thereto. Referring to FIG. 6A, first, a lower mold 210 is provided, and the lower mold 210 has a plurality of positioning pins 212. Next, referring to FIG. 6B, the hydrophobic gas-permeable membrane 120 is positioned on the lower mold 210 by the positioning pin 212. Specifically, the positioning pin 212 passes through the opening H40 of the hydrophobic gas-permeable membrane 120 to position the hydrophobic gas-permeable membrane 120. Next, referring to FIG. 6C, an upper mold 220 and the lower mold 210 are combined to form a molding chamber C10 that communicates with an injection passage 222 in the upper mold 220 and the lower mold 210. The upper mold 220 and the lower mold 210 further form a closed chamber C20. The closed chamber C20 is isolated from the molding chamber C10 and injection passage 222. In this embodiment, the injection passage 222 is located in the upper mold 220, but the disclosure is not limited thereto.

Figure 6D:
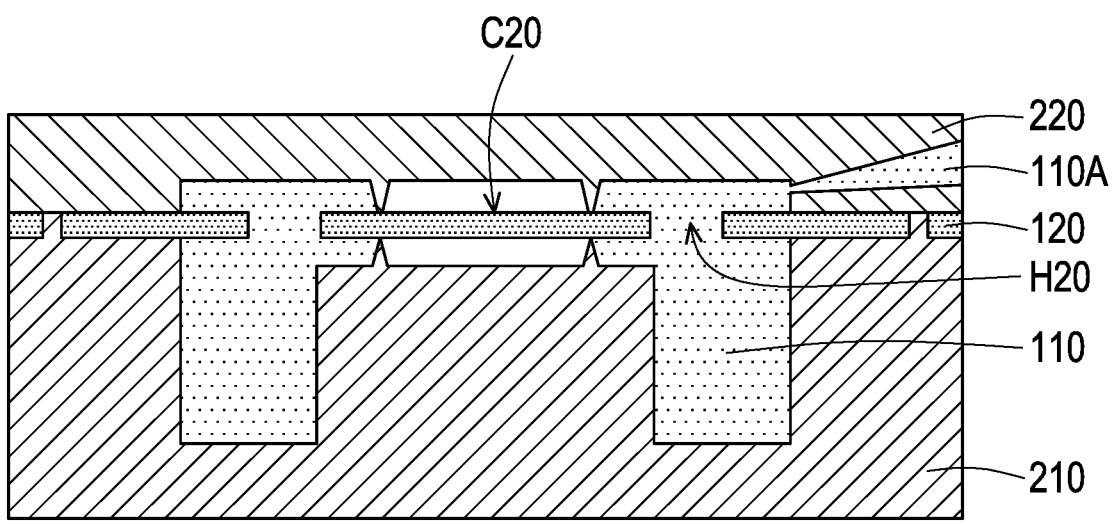
Figure 6E:
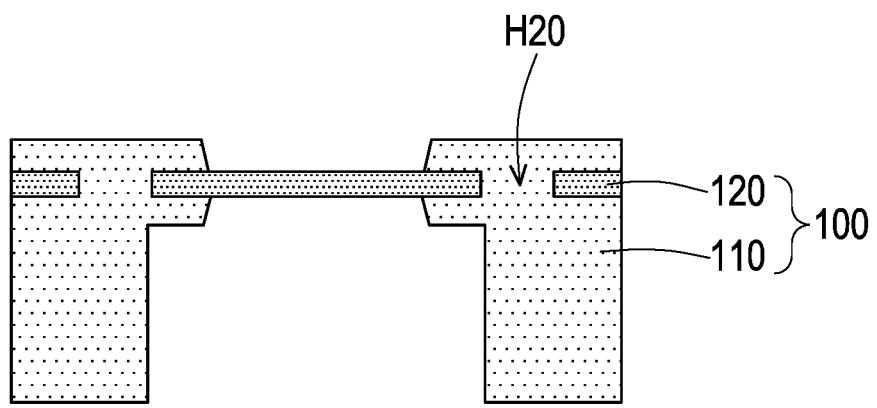

Next, referring to FIG. 6D, the packaging material 110A in liquid state is injected into the molding chamber C10 from the injection passage 222 and cured into the lid body 110. Since the closed chamber C20 is isolated from the molding chamber C10 and the injection passage 222, the packaging material 110A does not enter the closed chamber C20, and the through hole H10 is formed in the closed chamber C20. In addition, the packaging material 110A injected from the injection passage 222 also passes through the positioning hole H20, so when the packaging material 110A is cured into the lid body 110, it may pass through the positioning hole H20 to position the hydrophobic gas-permeable membrane 120. Finally, referring to FIG. 6E, the lid body 110 is removed from the upper mold 220 and the lower mold 210.

In summary, in the gas-permeable package lid of the chip package structure and the manufacturing method thereof of the disclosure, the hydrophobic gas-permeable membrane is embedded in the integrally formed lid body. When the lid body is formed, the hydrophobic gas-permeable membrane bonds with the lid body that the hydrophobic gas-permeable membrane may be stably positioned. An additional positioning structure is not required, and the hydrophobic breathable membrane does not fall off easily, and the process and material costs are low.

What is claimed is:

1. A gas-permeable package lid of a chip package structure, applied to a chip package structure, comprising:
   a lid body, integrally formed;
   a through hole, penetrating the lid body; and
   a hydrophobic gas-permeable membrane, bonded to the lid body and shielding the through hole, wherein a part of the hydrophobic gas-permeable membrane is embedded in the lid body,
   wherein the hydrophobic gas-permeable membrane comprises a membrane body and a plurality of positioning holes penetrating the membrane body, and the positioning holes are embedded in the lid body.

2. The gas-permeable package lid of the chip package structure according to claim 1, wherein the chip package structure further comprises a base and a chip disposed on the base, the through hole is located above the chip, and the hydrophobic gas-permeable membrane is suspended above the chip.

3. The gas-permeable package lid of the chip package structure according to claim 1, wherein the membrane body comprises an embedding portion embedded in the lid body and a shielding portion covering the through hole, and the positioning holes of the hydrophobic gas-permeable membrane penetrate the embedding portion and are located on opposite sides of the shielding portion.

4. The gas-permeable package lid of the chip package structure according to claim 3, wherein the lid body comprises a body portion surrounding the through hole and a plurality of hole anchoring portions located in the body portion, and the hole anchoring portions are respectively located in the positioning holes of the hydrophobic gas-permeable membrane.

5. The gas-permeable package lid of the chip package structure according to claim 4, wherein the hydrophobic gas-permeable membrane further comprises a plurality of notches, the notches penetrate the embedding portion of the membrane body and are adjacent to an edge of the membrane body, the lid body further comprises a plurality of notch anchoring portions located in the body portion, and the notch anchoring portions are respectively located in the notches of the hydrophobic gas-permeable membrane.

6. The gas-permeable package lid of the chip package structure according to claim 3, wherein the chip package structure further comprises a base and a chip disposed on the base, the hydrophobic gas-permeable membrane is suspended above the chip, the embedding portion of the hydrophobic gas-permeable membrane is located around the through hole, and a surface of the embedding portion that faces toward the chip and a surface of the embedding portion that faces away from the chip are both covered by the lid body.

7. The gas-permeable package lid of the chip package structure according to claim 3, wherein the chip package structure further comprises a base and a chip disposed on the base, the hydrophobic gas-permeable membrane is suspended above the chip, and neither a surface of the shielding portion of the hydrophobic gas-permeable membrane that faces toward the chip nor a surface of the shielding portion of the hydrophobic gas-permeable membrane that faces away from the chip is covered by the lid body.

8. The gas-permeable package lid of the chip package structure according to claim 1, wherein the positioning holes are located on opposite sides of the through hole.

9. The gas-permeable package lid of the chip package structure according to claim 1, wherein the hydrophobic gas-permeable membrane further comprises a plurality of notches that penetrate the membrane body, and the notches are adjacent to an edge of the membrane body and are embedded in the lid body.

10. The gas-permeable package lid of the chip package structure according to claim 9, wherein the notches are located on opposite sides of the through hole.

11. The gas-permeable package lid of the chip package structure according to claim 2, wherein the chip is a gas sensing chip.

12. The gas-permeable package lid of the chip package structure according to claim 1, wherein the hydrophobic gas-permeable membrane is coated with polytetrafluoroethylene.

13. The gas-permeable package lid of the chip package structure according to claim 1, wherein the chip package structure further comprises a base and a chip disposed on the base, wherein the hydrophobic gas-permeable membrane is suspended above the chip, and a surface of a part of the hydrophobic gas-permeable membrane around the through hole that faces toward the chip is not covered by the lid body, and a surface of the part of the hydrophobic gas-permeable membrane around the through hole that faces away from the chip is covered by the lid body.

14. A manufacturing method of a gas-permeable package lid of a chip package structure, comprising:
   providing a hydrophobic gas-permeable membrane; and
   curing a packaging material in liquid state into a lid body, wherein a through hole is formed in the lid body and penetrates the lid body, the hydrophobic gas-permeable membrane shields the through hole, a plurality of positioning holes of the hydrophobic gas-permeable membrane are embedded in the lid body, and a plurality of hole anchoring portions of the lid body are respectively located in the positioning holes.

15. The manufacturing method of the gas-permeable package lid of the chip package structure according to claim 14, wherein curing the packaging material in liquid state into the lid body and embedding the positioning holes of the hydrophobic gas-permeable membrane in the lid body is performing an embedded injection molding process.

16. The manufacturing method of the gas-permeable package lid of the chip package structure according to claim 14, wherein curing the packaging material in liquid state into the lid body and embedding the positioning holes of the hydrophobic gas-permeable membrane in the lid body comprises:
   providing a lower mold, wherein the lower mold has a plurality of positioning pins;
   positioning the hydrophobic gas-permeable membrane on the lower mold by the positioning pins;
   combining an upper mold and the lower mold to form a molding chamber communicating with an injection passage in the upper mold and the lower mold, wherein the upper mold and the lower mold further form a closed chamber, and the closed chamber is isolated from the molding chamber and the injection passage;
   injecting a packaging material in liquid state into the molding chamber from the injection passage and curing the packaging material into the lid body, wherein the through hole is formed in the closed chamber, and the packaging material passes through the positioning holes; and
   removing the lid body from the upper mold and the lower mold.

17. The manufacturing method of the gas-permeable package lid of the chip package structure according to claim 14, wherein a plurality of notches of the hydrophobic gas-permeable membrane are located at an edge of the hydrophobic gas-permeable membrane, and a plurality of notch anchoring portions of the lid body are respectively located in the notches.

18. The manufacturing method of the gas-permeable package lid of the chip package structure according to claim 14, wherein the hydrophobic gas-permeable membrane is coated with polytetrafluoroethylene.

* * * * *